(12) United States Patent
Chen et al.

(10) Patent No.: US 6,565,759 B1
(45) Date of Patent: May 20, 2003

(54) ETCHING PROCESS

(75) Inventors: Bi-Ling Chen, Taipei (TW); Erik S. Jeng, Hsin-Chu (TW); Hao-Chieh Liu, Taipei (TW)

(73) Assignee: Vanguard International Semiconductor Corporation, Hsin-Chu (TW)

( * ) Notice: Subject to any disclaimer, the term of this patent is extended or adjusted under 35 U.S.C. 154(b) by 0 days.

(21) Appl. No.: 09/375,203

(22) Filed: Aug. 16, 1999

(51) Int. Cl.$^7$ ............................................ H01G 9/00
(52) U.S. Cl. ........................ 216/6; 216/16; 216/17; 216/41; 216/58; 216/61; 438/706; 438/710; 438/711
(58) Field of Search ...................... 216/16, 17, 41, 216/58, 61, 63, 64, 67, 72, 79, 80; 438/706, 710, 711, 714, 721, 723, 733, 737, 738, 743, 744

(56) References Cited

U.S. PATENT DOCUMENTS

| | | | | |
|---|---|---|---|---|
| 5,562,801 A | * | 10/1996 | Nulty | 156/643.1 |
| 5,569,356 A | * | 10/1996 | Lenz et al. | 156/643.1 |
| 5,707,486 A | * | 1/1998 | Collins | 156/643.1 |
| 5,770,098 A | | 6/1998 | Araki et al. | 216/67 |
| 5,856,239 A | * | 1/1999 | Bashir et al. | 438/738 |
| 5,900,163 A | * | 5/1999 | Yi et al. | 216/79 |
| 5,972,235 A | * | 10/1999 | Brigham et al. | 216/49 |
| 6,015,761 A | * | 1/2000 | Merry et al. | 438/727 |
| 6,074,959 A | * | 6/2000 | Wang et al. | 438/738 |
| 6,165,375 A | * | 12/2000 | Yang et al. | 216/67 |
| 6,207,353 B1 | * | 3/2001 | Armacost et al. | 430/313 |

* cited by examiner

*Primary Examiner*—Randy Gulakowski
*Assistant Examiner*—Gentle Winter
(74) *Attorney, Agent, or Firm*—George O. Saile; Stephen B. Ackerman; Stephen G. Stanton

(57) ABSTRACT

A method for etching a pattern within a silicon containing dielectric layer upon a substrate employed within a microelectronics fabrication, employing a plasma activated reactive gas mixture, with layer material etch rate, etch rate ratio and pattern aspect ratio controlled by controlling the gas composition. There is provided a silicon substrate formed upon it a patterned microelectronics layer over which is formed a silicon containing dielectric layer. There is placed the silicon substrate within a reactor chamber equipped with electrodes which is evacuated. There is then filled the reactor chamber with a reactive gas mixture consisting of an oxidizing gas and two reactive gases. There may be optionally included in the reactive gas mixture nitrogen and inert gases for control purposes, but excluded from the reactive gas mixture are oxidizing gases containing carbon and oxygen. There is then formed a plasma by supplying high frequency electrical energy to the electrodes within the reactor chamber to bring about a plasma activated reactive gas etching environment, where the conditions may be selected to optimize the desired etch rate and etch rate selectivity.

21 Claims, 4 Drawing Sheets

ETCHING PROCESS

BACKGROUND OF THE INVENTION

1. Field of the Invention

The invention relates to the field of manufacture of microelectronics fabrications. More particularly, the invention relates to the field of pattern formation by subtractive etching of microelectronics layers employed within microelectronics fabrications.

2. Description of the Related Art

Microelectronics fabrications are comprised generally of layers of microelectronics materials formed upon microelectronics substrates. Many of the microelectronics layers are formed into patterns in order to embody their functions within the microelectronics fabrications. The materials employed may be microelectronics conductor, microelectronics semiconductor and microelectronics dielectric materials.

Of particular interest for microelectronics fabrication are patterned microelectronics dielectric layers formed from undoped or doped silicon containing dielectric materials. It is commonly required to employ patterns wherein there are very fine features such as contact via holes, fine lines and other features with high aspect ratios in the dielectric layer. Such patterns may be formed employing photolithographic methods and materials to form etching mask layers over the dielectric layer and subtractive etching of the dielectric layer through the etch mask. Because of the need for ever smaller dimensions, plasma activated gas phase reactive etching is widely employed as the subtractive etching method.

Although satisfactory for serving the needs of microelectronics fabrication in general, such plasma activated gas phase reactive etching methods are not without problems. For instance, it is sometimes difficult to maximize for a given etch method the etch rate and/or dimensional resolution of a given silicon containing material while still retaining the large discrimination of high etch rate for the material being etched and low etch rate for the etch mask material. Likewise, it is often difficult to maintain the high resolution etching capability of the reactive etching method equally well for more than one silicon containing dielectric material.

It is thus towards the goal of providing an etch method with high discrimination between the etched pattern material and the etch mask material as well as high resolution etching capability that the present invention is directed.

Various methods have been disclosed to provide etch rate discrimination and resolution of very fine etched features in plasma activated subtractive etching of silicon containing dielectric materials.

For example, Araki et al., in U.S. Pat. No. 5,770,098, disclose an etching method with high etching selectivity for silicon oxide layers which prevents formation of fence defects in the etched pattern. The method employs a carbon monoxide oxidizing gas and a reactive gas consisting of Group IV and Group VII elements but not containing hydrogen in a plasma activated process in a reactor chamber.

Desirable in the art of microelectronics fabrication are additional methods for etching high resolution patterns at high rates with discrimination between high pattern etching rates and low mask etching in silicon containing dielectric layers employing plasma activated reactive etching gases.

It is towards these goals that the present invention is generally and more specifically directed.

SUMMARY OF THE INVENTION

A first object of the present invention is to provide a method for etching a pattern in a silicon containing dielectric layer upon a substrate employed within a microelectronics fabrication.

A second object of the present invention is to provide a method in accord with the first object of the present invention where the pattern is subtractively etched employing a plasma activated reactive gas mixture.

A third object of the present invention is to provide a method in accord with the first object of the present invention and/or the second object of the present invention where the relative etch rates of material layers and etch rate selectivity of the etching process is controlled by the gas composition A fourth object of the present invention is to provide in accord with the first object of the present invention, the second object of the present invention and the third object of the present invention where the method is readily commercially implemented.

In accord with the objects of the present invention, there is provided a method for etching within a silicon containing dielectric layer upon a substrate employed within a microelectronics fabrication a pattern employing a plasma activated reactive gas mixture with etch rate, aspect ratio and etch rate ratio controlled by gas composition. To practice the invention, there is provided a silicon containing dielectric layer upon a substrate employed within a microelectronics fabrication. There is placed the substrate within a reactor chamber containing electrodes which is evacuated. There is then filled the reactor chamber with a reactive gas mixture consisting of an oxidizing gas and two reactive gases. Nitrogen and inert carrier gases may also be included, but excluded are oxidizing gases containing carbon and oxygen. There is then supplied high frequency electrical energy to the electrodes to bring about a plasma activated reactive gas etching environment, with the conditions chosen to optimize the etching reaction rate and etching rate selectivity of the etching process for particular silicon containing dielectric layers and etch mask layers.

The present invention provides a method for selective etching of a pattern within a silicon containing dielectric layer upon a substrate employed within a microelectronics fabrication. The etch rate and etch rate selectivity for the particular silicon containing dielectric material and etch mask layer material may be chosen by control of the etching gas composition.

The present invention provides a reactive gas which upon plasma activation subtractively etches silicon containing dielectric materials. The reactive gas employs an oxidizing gas as well as reactive gases and carrier gases, but the precise control and selectivity of etch rates are better obtained with exclusion of oxidizing gases containing carbon and oxygen, as such gases are observed to limit the etch rate range of silicon containing dielectric materials as their composition varies.

The method of the present invention may be employed to form a pattern within a silicon containing dielectric layer formed upon a substrate employed within a microelectronics fabrication which may be chosen from the group including but not limited to integrated circuit microelectronics fabrications, charge coupled microelectronics fabrications, solar cell microelectronics fabrications, radiation emitting microelectronics fabrications, optoelectronics display microelectronics fabrications, ceramic substrate microelectronics fabrications and flat panel display microelectronics fabrications.

The method of the present invention employs methods and materials which are known in the art of microelectronics fabrication, but in a novel order and sequence. Therefore the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENTS

The present invention provides a method for etching within a silicon containing dielectric layer formed upon a substrate employed within a microelectronics fabrication a pattern employing plasma activated reactive etching gas wherein the etch rate and selectivity of the silicon containing dielectric material are controlled by the composition of the etching gas.

First Preferred Embodiment

Figure 1:
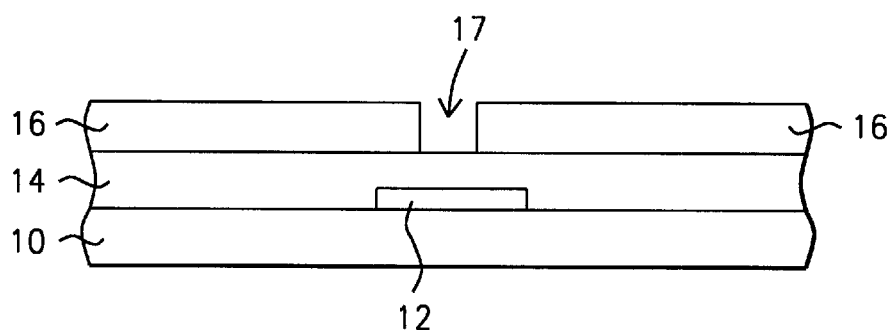
FIG. 1 and FIG. 2 are a series of schematic cross-sectional drawings illustrating the results of progressive stages in etching within a silicon containing dielectric layer formed upon a substrate employed within a microelectronics fabrication a pattern in accord with a general embodiment of the present invention which constitutes a first preferred embodiment of the present invention, where the etch rate and selectivity for the silicon containing dielectric layer and etch mask layer are controlled by the composition of the etching gas composition.
Figure 2:
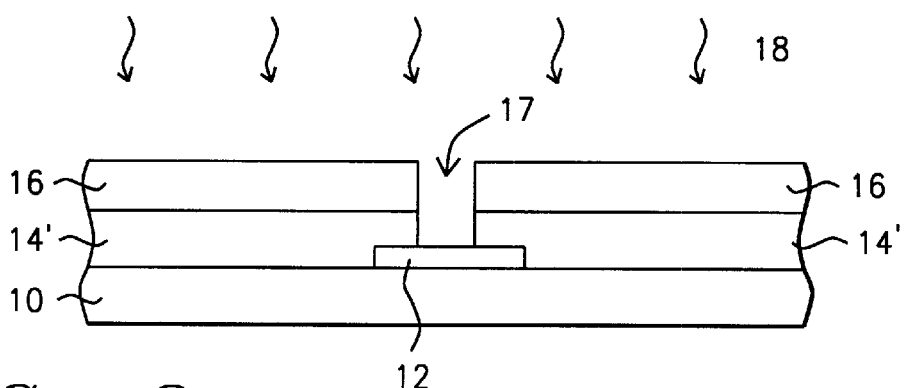

Referring now to FIG. 1 to FIG. 2, there is shown a series of schematic cross-sectional diagrams illustrating the results of etching a pattern within a silicon containing dielectric layer formed upon a substrate employed within a microelectronics fabrication wherein the etch rate and etch rate selectivity of the silicon containing dielectric layer is controlled by the composition of the etching gas. FIG. 1 is a schematic cross-sectional diagram of a microelectronics fabrication at an early stage in its fabrication in accord with the first preferred embodiment of the present invention.

Shown in FIG. 1 is a substrate 10 upon which is formed a patterned microelectronics layer 12. Formed over the substrate is a silicon containing dielectric layer 14. Formed over the silicon containing dielectric layer is a patterned etch mask layer 16

With respect to the substrate 10 shown in FIG. 1, the substrate 10 may be the substrate itself employed within the microelectronics fabrication or, alternatively, the substrate 10 may include any of several microelectronics layers formed upon the substrate employed within the microelectronics fabrication. Preferably the substrate 10 is a silicon semiconductor substrate With respect to the patterned microelectronics layer 12 shown in FIG. 1, the patterned microelectronics layer 12 may be formed of microelectronics conductor material, microelectronics semiconductor material or microelectronics dielectric material employing methods as are known in the art of microelectronics fabrication for forming and patterning layers of microelectronics material within microelectronics fabrications. Preferably the patterned microelectronics layer 12 is a patterned microelectronics conductor layer.

With respect to the silicon containing dielectric layer 14 shown in FIG. 1, the silicon containing dielectric layer 14 is formed from doped silicon oxide dielectric material employing plasma enhanced chemical vapor deposition (PECVD). Preferably the doped silicon oxide dielectric material is formed employing boron and phosphorus dopant materials in accord . . . with the following process steps: (1) silicon source gas tetra-ethyl-ortho-silicate (TEOS) vapor at a flow rate of from about 500 to about 600 milligrams per minute (mg/min); (2) carrier gas nitrogen; (3) boron dopant source tri-ethyl borate(TEB) at a flow rate of from about 180 to about 220 milligrams per minute (mg/min); (4) phosphorus dopant source tri-ethyl-phosphate (TEP) at a flow rate of from about 25 to about 35 milligrams per minute (mg/min); and ozone ($O_3$) gas flow rate of from about 3000 to about 5000 standard cubic centimeters per minute (sccm).

With respect to the patterned etch mask layer 16 having the pattern 17 formed therein shown in FIG. 1, the patterned etch mask layer 16 may be formed of materials and methods as are known in the art of photolithography employed within the art of microelectronics fabrication.

Referring now more particularly to FIG. 2, there is shown a schematic cross-sectional diagram illustrating the results of further processing of the microelectronics fabrication whose schematic cross-sectional diagram is shown in FIG. 1. Shown in FIG. 2 is a microelectronics fabrication otherwise equivalent to the microelectronics fabrication shown in FIG. 1, but where there has been etched into the silicon containing dielectric layer the pattern 17 employing the etch mask layer 16 and a reactive etching gas environment 18 activated by a plasma.

With respect to the reactive etching gas environment 18 shown in FIG. 2, the reactive etch gas 18 employs an oxidizing gas, reactive gases, and optionally nitrogen and inert carrier gases. Preferably the composition of the reactive gas etching environment consists of: (1) oxygen at a concentration of up to 60% of total gas flow rate; (2) a first reactive gas composed of at least one element from Group IV of the Periodic Table of Elements, at least one element from Group VII of the Periodic Table and free of hydrogen, such as $C_xF_y$; (3) a second reactive gas composed of at least one element from Group IV of the Periodic Table, at least one element from Group VII of the Periodic Table and hydrogen, such as $C_xF_yH_z$; and optionally (4) nitrogen and (5) inert carrier gases. The oxidizing capability of oxygen gas within the etching reactions is uniform over the range of allowed oxygen concentration, which is a novel aspect of the present invention. For example, the etching gas composition of the present invention excludes carbon monoxide (CO) as an oxidizing gas because, although CO provides a high selectivity of etch rate for silicon oxide over photoresist as noted in the related art, the etch rate decreases with increasing concentration of CO and eventually stops.

With respect to the plasma activation of the reactive gas etching environment 18, the plasma activation is accomplished in accord with the following process: (1) power of from about 300 to about 2000 Watts; and (2) frequency of 13.56 MHz.

The present invention provides a method for etching within a silicon containing dielectric layer formed upon a substrate employed within a microelectronics fabrication a pattern wherein etching rates of the silicon containing dielectric layer and etch rate selectivity have been controlled by the composition of the etching gas. The present invention provides for the etching selectively different silicon containing dielectric materials such as doped silicon oxide through etch etch masks while maintaining high etch rates and etch rate selectivity.

Second Preferred Embodiment

Figure 7:
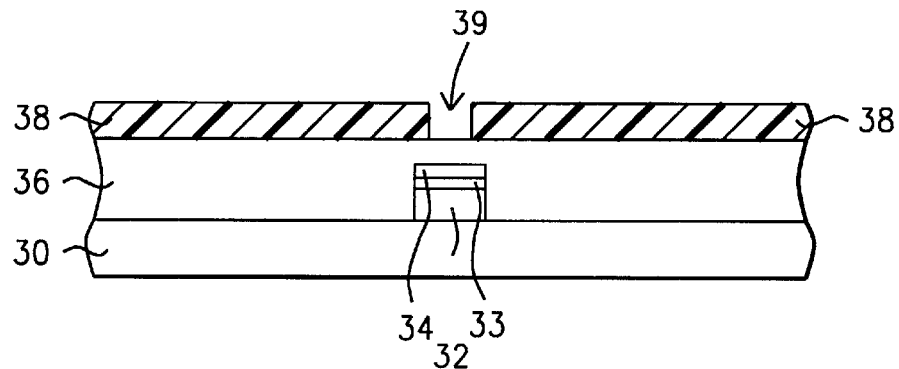
FIG. 7, FIG. 8 and FIG. 9 are a series of schematic cross-sectional diagrams illustrating progressive stages in the etching of a pattern in silicon containing dielectric layers formed upon a substrate employed within an integrated circuit microelectronics fabrication in accord with a more specific embodiment of the present invention which constitutes a second preferred embodiment of the present invention, where the etch rates and selectivity of the etch rates of the silicon containing dielectric layers are controlled by the composition of the etching gases.
Figure 8:
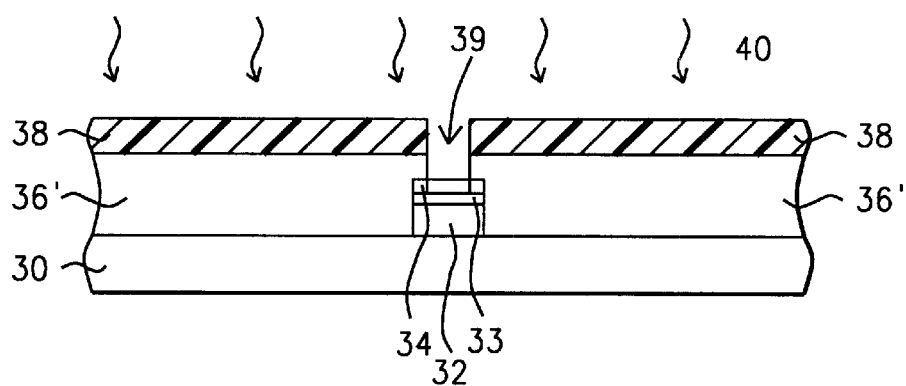
Figure 9:
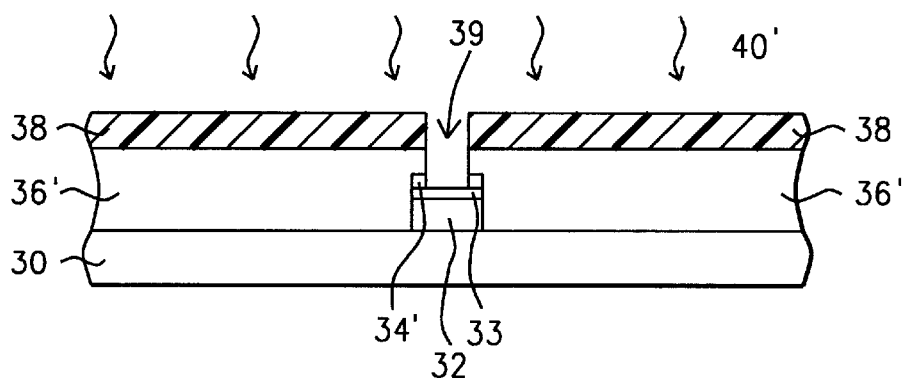

Referring now more particularly to FIG. 7 to FIG. 9, there is shown a series of schematic cross-sectional diagrams illustrating progressive stages in the etching of a pattern within silicon containing dielectric layers upon a substrate employed within an integrated circuit microelectronics fabrication in accord with a more specific embodiment of the present invention which constitutes a second preferred embodiment of the present invention. FIG. 7 is a schematic cross-sectional diagram of an integrated circuit microelectronics fabrication at an early stage in its fabrication in accord with the second preferred embodiment of the present invention.

Shown in FIG. 7 is a substrate 30 upon which is formed a patterned microelectronics conductor layer 32. Formed upon the microelectronics conductor layer is a self-aligned metal silicide (salicide) contact layer 33 capped by a silicon nitride dielectric layer 34. Formed over the substrate is a silicon containing dielectric layer 36. Formed over the silicon containing dielectric layer is an etch mask layer 38 patterned with pattern 39.

With respect to the semiconductor substrate 30 shown in FIG. 7, the semiconductor substrate 30 is analogous to the substrate 10 shown in FIG. 1 of the first preferred embodiment of the present invention. Preferably the semiconductor substrate 30 is a silicon semiconductor substrate.

With respect to the patterned microelectronics conductor layer 32 shown in FIG. 7, the patterned microelectronics conductor layer 32 is formed of microelectronics conductor materials employing methods which are known in the art of microelectronics fabrication. Preferably the patterned microelectronics conductor layer 32 is a polysilicon layer.

With respect to the salicide contact layer 33 shown in FIG. 7, the salicide contact layer is a metal silicide self aligned electrical contact layer formed on the patterned microelectronics conductor layer 32 employing methods and materials as are known in the art of microelectronics fabrication. Preferably the salicide contact layer 33 is formed employing a metal silicide such as, for example, tungsten silicide ($WSi_x$).

With respect to the silicon nitride cap layer 34 shown in FIG. 7, the silicon nitride cap layer 34 is formed employing methods which are known in the art of microelectronics fabrication. Preferably the silicon nitride layer 34 is formed employing chemical vapor deposition (CVD) method.

With respect to the silicon oxide dielectric layer 36 shown in FIG. 7, the silicon oxide dielectric layer 36 is analogous or equivalent to the silicon containing dielectric layer 14 shown in FIG. 1 of the first preferred embodiment of the present invention.

With respect to the patterned photoresist etch mask layer 38 and pattern 39 shown in FIG. 7, the patterned photoresist etch mask layer 37 and pattern 39 are formed employing materials as are known in the art of photolithography employed in microelectronics fabrication.

Referring now more particularly to FIG. 8, there is shown a schematic cross-sectional diagram illustrating the results of further processing of the integrated circuit microelectronics fabrication whose schematic cross-sectional diagram is shown in FIG. 7 in accord with the second preferred embodiment of the present invention. Shown in FIG. 8 is an integrated circuit microelectronics fabrication otherwise equivalent to the integrated circuit microelectronics fabrication shown in FIG. 7, but where there has been etched the pattern of the photoresist etch mask layer 38 through the silicon oxide dielectric layer 36 employing a plasma activated reactive etching gas environment 40.

With respect to the plasma activated reactive gas etching environment 40 shown in FIG. 8, the plasma activated reactive gas environment 40 is analogous or equivalent to the plasma activated reactive gas mixture 18 shown in FIG. 2 of the first preferred embodiment of the present invention.

Referring now more particularly to FIG. 9, there is shown a schematic cross-sectional diagram illustrating the results of further processing of the integrated circuit microelectronics fabrication whose schematic cross-sectional diagram is shown in FIG. 8 in accord with the second preferred embodiment of the present invention. Shown in FIG. 9 is an integrated circuit microelectronics fabrication otherwise equivalent to the integrated circuit microelectronics fabrication shown in FIG. 8, but where there has been further etched the pattern 39 through the silicon nitride cap layer 34 to the salicide contact layer 33 employing the modified plasma activated reactive etching gas environment 40'.

With respect to the modified plasma activated reactive etching gas environment 40' shown in FIG. 9, the modified plasma activated reactive gas environment 40' is modified from the plasma activated reactive etching gas environment 40 shown in FIG. 8 by the addition of nitrogen gas to the reactive gas mixture in situ in the reactor chamber.

The second preferred embodiment of the present invention provides a method for etching a pattern within silicon oxide and other silicon containing dielectric layers formed upon a semiconductor substrate employed within an integrated circuit microelectronics fabrication. The etch rates and etch rate selectivity of the silicon oxide and silicon containing dielectric layers is controlled by the composition of the reactive gas mixture. In particular, the etch rate ratio for different dielectric materials may be selectively kept at a high value compared to the etch rate of photoresist etch mask layers.

Experimental

Figure 3:
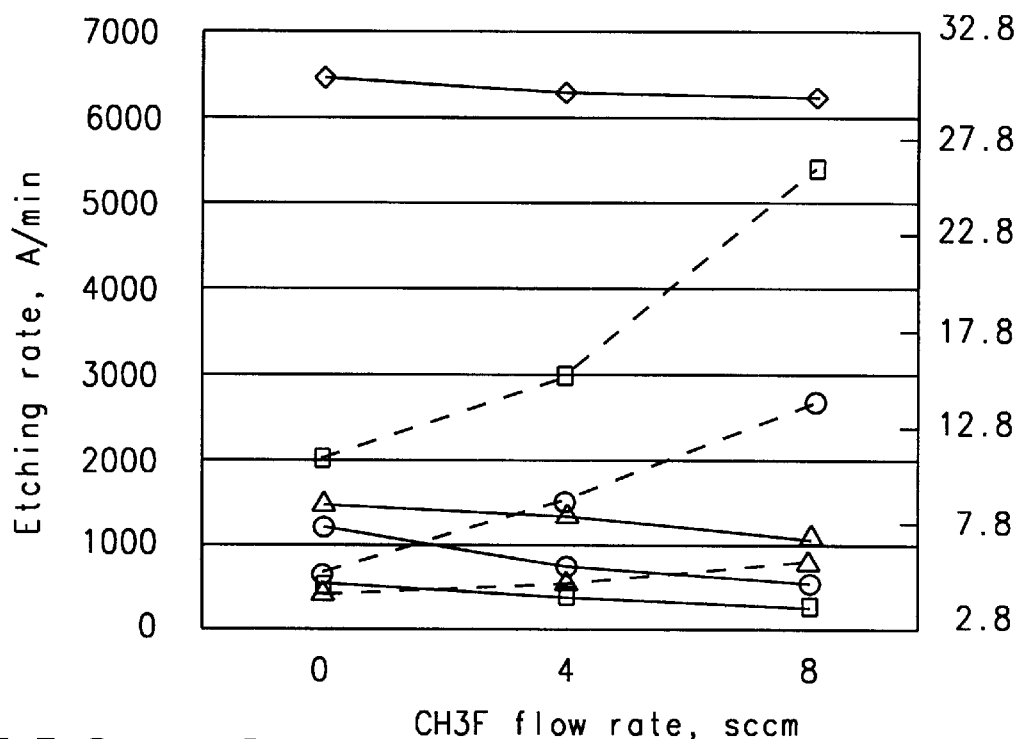
FIG. 3 is a graph of the etching rate and etch rate selectivity of various microelectronics layers versus the flow rate of fluoromethane ($CH_3F$) in the etching gas whose fixed composition is 24 standard cubic centimeters per minute (sccm) $C_4F_8$, and 12 standard cubic centimeters per minute (sccm) $O_2$.

The benefits and advantages of the present invention are seen in the results of experimental determinations of the etch rate and etch rate selectivity of various microelectronics materials employing various reactive gas compositions as provided in the present invention. The etch rate and selectivity were measured for several materials as a function of the amount of second reactive gas for a fixed amount of oxygen, first reactive gas $C_4F_8$ and carrier gas, and are shown in FIG. 3 for fluoromethane ($CH_3F$), FIG. 4 for difluoromethane ($CH_2F_2$), and FIG. 5 for trifluoromethane ($CHF_3$) respectively. Shown in FIG. 6 is a graph illustrating the dependence of the etch rate and selectivity of etch rate for various microelectronics materials versus the amount of nitrogen contained in fixed reactive etch gas composition of 24 standard cubic centimeters per minute (sccm) $C_4F_8$, 16 standard cubic centimeters per minute (sccm) $CH_2F_2$, and 10 standard cubic centimeters per minute (sccm) $O_2$.

Figure 4:
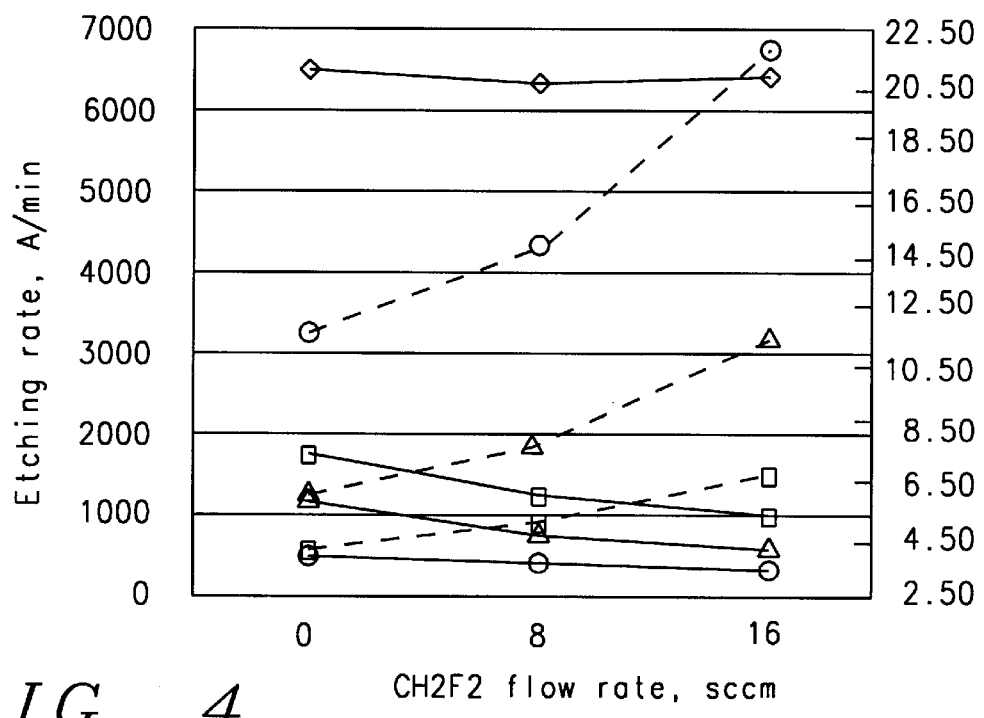
FIG. 4 is a graph of the etching rate and etch rate selectivity of various microelectronics layers versus the flow rate of difluoromethane ($CH_2F_2$) in the same fixed etching gas composition as FIG. 3.
Figure 5:
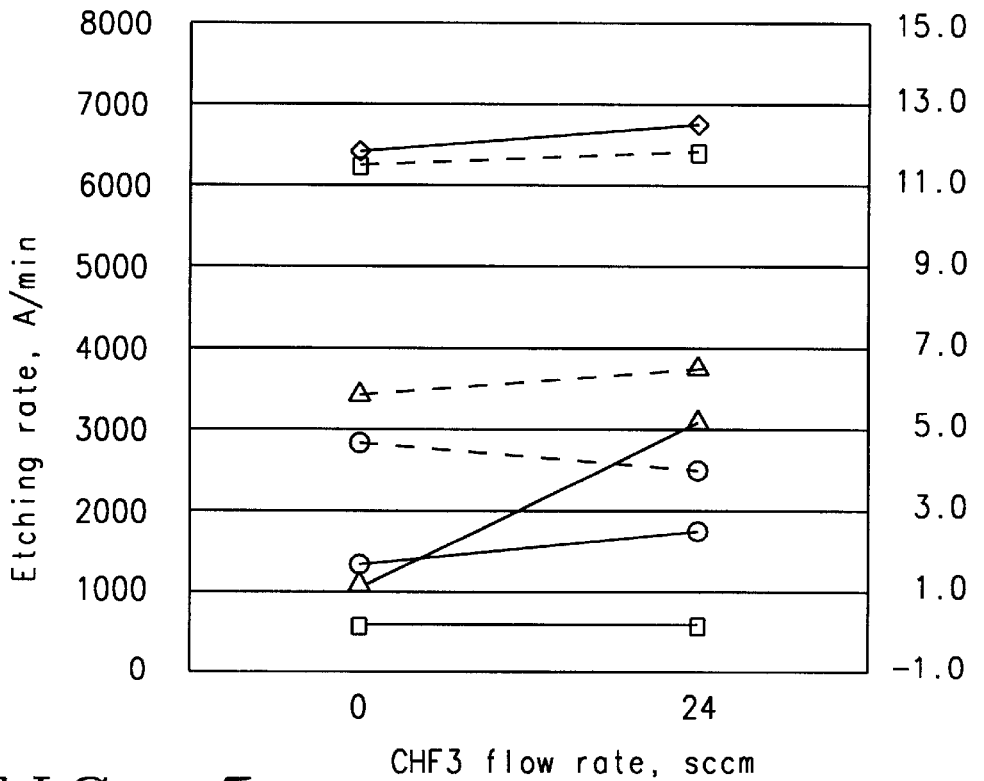
FIG. 5 is a graph of the etching rate and etch rate selectivity of various microelectronics layers versus the flow rate of trifluoromethane ($CHF_3$) in the same fixed etching gas composition as FIG. 3.

It is seen in the graphs of FIG. 3 to FIG. 5 that varying the amount of the second reactive gas with respect to the other components of the reactive gas mixture can be used to select the etch rate and etch rate selectivity as desired. In addition to silicon containing dielectric materials which may be doped, etch rates and etch rate selectivity for microelectronics material layers of polysilicon are also given in FIG. 3 to FIG. 5.

Figure 6:
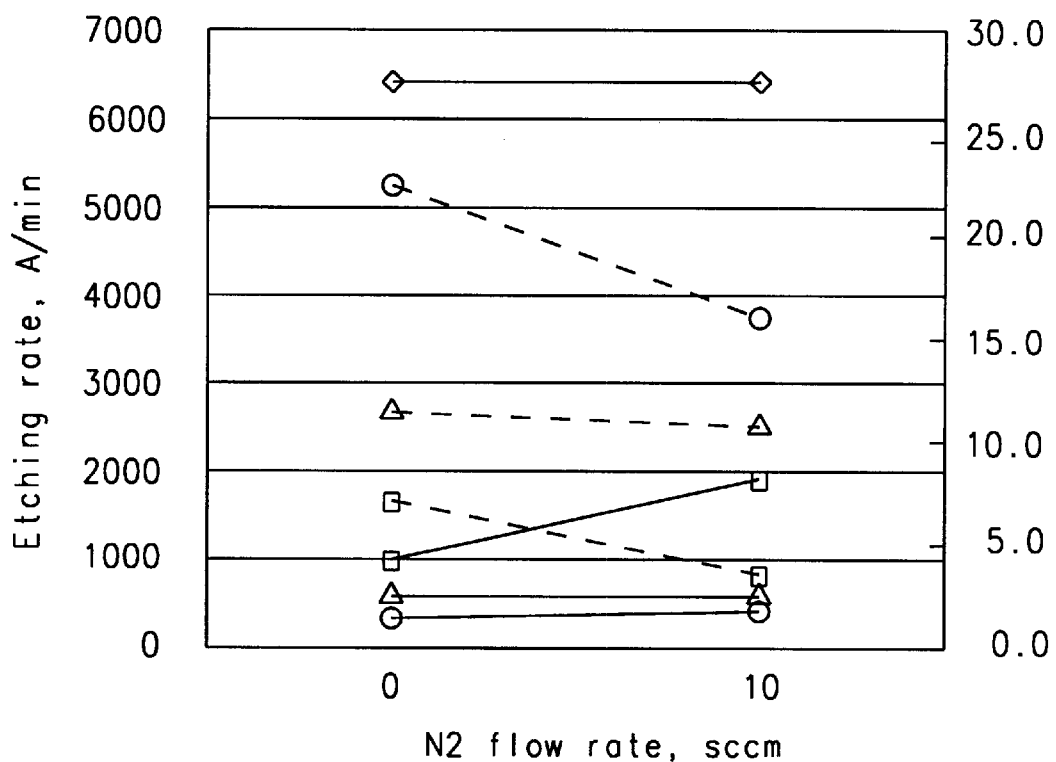
FIG. 6 is a graph of the etching rate and etch rate selectivity of various microelectronics layers versus the flow rate of nitrogen ($N_2$) in the etching gas whose fixed composition is 24 standard cubic centimeters per minute (sccm) $C_4F_8$, 10 standard cubic centimeters per minute (sccm) $O_2$ and 16 standard cubic centimeters per minute (sccm) CxHyFz, which represents any of the fluorinated derivatives of methane.

It is seen in the graph of FIG. 6 that varying the amount of nitrogen gas in the reactive gas mixture can selectively increase the etch rate of silicon nitride without affecting the etch rate of silicon oxide or the etch rate selectivity of other materials.

As is understood by a person skilled in the art, the preferred embodiment of the present invention is illustrative of the invention rather than limiting of the present invention. Revisions and modifications may be made to materials, structures and dimensions through which is provided the preferred embodiment of the present invention while still providing embodiments which are within the spirit and scope of the present invention, as defined by the appended claims.

What is claimed is:

1. A method for etching a silicon oxide dielectric layer comprising:
   providing a substrate having formed upon it a patterned microelectronics layer;
   forming over the substrate a PECVD silicon oxide dielectric layer formed under the following conditions:
      a silicon source gas TEOS vapor a flow rate of from about 500 to 600 mg/min;
      a nitrogen carrier gas;
      a boron dopant TEB at a flow rate of from about 180 to 220 mg/min;
      a phosphorus dopant source TEP at a flow rate of from about 25 to 35 mg/min; and
      an ozone gas flow rate of from about 3000 to 5000 sccm;
   forming over the silicon oxide dielectric layer a mask layer; and
   etching the silicon oxide dielectric layer in a plasma sustained by high frequency electrical power at about 13.56 MHz, employing the mask layer as a plasma etch mask layer while employing a plasma etchant gas composition comprising oxygen, a perfluorocarbon gas and a hydrofluorocarbon gas, but excluding any oxidizing gas or gases having a formula containing both carbon and oxygen.

2. The method of claim 1 wherein there is formed over the substrate a silicon oxide layer in contact with a silicon nitride layer.

3. The method of claim 1 wherein the exclusion of an oxidizing gas or gases containing both carbon and oxygen in the plasma etchant gas mixture provides a uniform silicon oxide/silicon nitride etch rate ratio.

4. The method of claim 1 wherein the substrate is a substrate employed within a microelectronics fabrication selecterd from the group consisting of:
   integrated circuit microelectronics fabrications,
   charge coupled device microelectronics fabrications,
   solar cell microelectronics fabrications,
   radiation emitting device microelectronics fabrications,
   optoelectronics display microelectronics fabrications,
   ceramic substrate microelectronics fabrications, and
   flat panel display microelectronics fabrications.

5. The method of claim 1 wherein the dielectric layer is formed of silicon oxide dielectric material employing plasma enhanced chemical vapor deposition (PECVD).

6. The method of claim 1 wherein the oxidizing gas is oxygen which may be present up to 60 volumetric % by gas flow rate in the total reactive gas mixture.

7. The method of claim 1 wherein the first reactive gas may be present up to 75 volumetric % by gas flow rate in the total reactive gas mixture.

8. The method of claim 1 wherein the second reactive gas may be present up to 75 volumetric % by gas flow rate in the total reactive gas mixture.

9. The method of claim 1 wherein the nitrogen gas may be present up to 30 volumetric % by gas flow rate in the total reactive gas mixture.

10. The method of claim 1 wherein the inert gas or gases may be present up to 70 volumetric % by gas flow rate in the total reactive gas mixture.

11. The method of claim 9 wherein the inert gas or gases are selected from the group consisting of argon, krypton and xenon.

12. The method of claim 1 wherein the high frequency electrical power is supplied at a frequency of 13.56 MHz from about 300 to about 2000 Watts.

13. A method for etching a pattern within a dielectric layer formed upon a silicon semiconductor substrate employed within an integrated circuit microelectronics fabrication comprising:
   providing a silicon semiconductor substrate having formed upon it a microelectronics conductor pattern over which is formed first a PECVD silicon oxide dielectric layer, secondly a silicon nitride layer, and finally a patterned photoresist etch mask layer; the PECVD silicon oxide dielectric layer being formed under the following conditions:
      a silicon source gas TEOS vapor a flow rate of from about 500 to 600 mg/min;
      a nitrogen carrier gas;
      a boron dopant TEB at a flow rate of from about 180 to 220 mg/min;
      a phosphors dopant source TEP at a flow rate of from about 25 to 35 mg/min; and
      an ozone gas flow rate of from about 3000 to 5000 sccm;
   introducing said silicon semiconductor substrate into a reactor chamber equipped with electrodes;
   evacuating said reactor chamber;
   filling said reactor chamber with a reactive gas mixture further comprising:

oxygen gas;
a first reactive gas having a formula containing carbon and fluorine;
a second reactive gas having a formula containing carbon, fluorine and hydrogen;
nitrogen gas; and
an inert gas or gases but excluding from said first and second reactive gas mixtures any oxidizing gas or gases having a formula
containing both carbon and oxygen;
supplying high frequency electrical power at about 13.56 MHz from about 300 to 2000 watts to the reactor to sustain a plasma in the reactive gas mixture; and
etching a pattern into the silicon oxide dielectric layer and silicon nitride layer through to the underlying patterned conductor layer employing the patterned photoresist etch mask layer and the plasma activated reactive gas mixture.

14. The method of claim 13 wherein there is formed over the silicon oxide dielectric layer a silicon nitride layer for which there is obtained a selective silicon oxide/silicon nitride plasma etch rate ratio by excluding from the reactive gas mixture any oxidizing gas or gases containing both carbon and oxygen, and by controlling the amount of nitrogen gas added to the reactive gas mixture.

15. The method of claim 13 wherein the silicon oxide dielectric layer is formed from boron and phosphorus (B,P) doped silicon oxide dielectric material employing plasma enhanced chemical vapor deposition (PECVD).

16. The method of claim 13 wherein the oxygen gas is present in the total gas mixture up to 60 volumetric % by gas flow rate.

17. The method of claim 13 wherein the first reactive gas is present in the total gas mixture up to 75 volumetric % by gas flow rate.

18. The method of claim 13 wherein the second reactive gas is present in the total gas mixture up to 75 volumetric % by gas flow rate.

19. The method of claim 13 wherein the nitrogen gas is present in the total gas mixture up to 30 volumetric % by gas flow rate.

20. The method of claim 13 wherein the inert gas is present in the total gas mixture up to 70 volumetric % by gas flow rate.

21. The method of claim 20 wherein the inert gas mixture comprises argon, krypton and xenon.

* * * * *